United States Patent [19]
Johansson et al.

[11] Patent Number: 5,907,180
[45] Date of Patent: May 25, 1999

[54] BALLAST MONITORING FOR RADIO FREQUENCY POWER TRANSISTORS

[75] Inventors: Ted Johansson, Hagersten, Sweden; Larry Leighton, Santa Cruz, Calif.

[73] Assignee: Telefonaktiebolaget L.M. Ericsson, Stockholm, Sweden

[21] Appl. No.: 08/787,821

[22] Filed: Jan. 22, 1997

Related U.S. Application Data

[63] Continuation of application No. 08/545,905, Oct. 19, 1995, abandoned, which is a continuation of application No. 08/335,413, Nov. 3, 1994, abandoned.

[51] Int. Cl.$^6$ ...................... H01L 27/082; H01L 27/102; H01L 29/70; H01L 31/11
[52] U.S. Cl. ................... 257/580; 257/163; 257/164; 257/578; 257/579; 257/581; 257/582
[58] Field of Search ...................... 257/163, 164, 257/165, 166, 578, 579, 580, 581, 582, 539, 542

[56] References Cited

U.S. PATENT DOCUMENTS

| | | | |
|---|---|---|---|
| 3,896,475 | 7/1975 | Bonis | 357/35 |
| 4,072,979 | 2/1978 | Palara | 357/36 |
| 4,656,496 | 4/1987 | Widlar | 357/36 |
| 5,023,693 | 6/1991 | Mori et al. | 357/46 |
| 5,053,847 | 10/1991 | Ito et al. | 357/36 |
| 5,061,863 | 10/1991 | Mori et al. | 307/350 |
| 5,138,417 | 8/1992 | Noda | 257/542 |
| 5,204,735 | 4/1993 | Yamamoto et al. | 257/528 |
| 5,298,785 | 3/1994 | Ito et al. | 257/538 |
| 5,387,813 | 2/1995 | Iranmanesh et al. | 257/579 |

Primary Examiner—Mahshid Saadat
Assistant Examiner—Jesse A. Fenty
Attorney, Agent, or Firm—Lyon & Lyon LLP

[57] ABSTRACT

The present invention, generally speaking, provides an apparatus and method whereby the current flow through an RF power transistor may be monitored without the use of any external parts. More particularly, in accordance with one embodiment of the invention, an RF power transistor includes a silicon die, a pair of interdigitated electrodes formed on the silicon die, each having a multiplicity of parallel electrode fingers and at least one bond pad. Regions of a first type of diffusion are formed beneath electrode fingers of one electrode of the pair of interdigitated electrodes, and regions of a second type of diffusion are formed beneath electrode fingers of another electrode of the pair of interdigitated electrodes. One electrode has multiple electrode fingers and multiple resistors formed on the silicon die, at least one resistor connected in series with each one of the electrode fingers. A further electrode is provided having at least one electrode finger and connected to a further bond pad, and at least one resistor is formed on the silicon die and connected in series with the further electrode. In accordance with another embodiment of the invention, a method is provided for monitoring and controlling current flow in an integrated RF transistor within an RF transistor circuit. The integrated RF transistor has multiple emitter ballast resistors and a circuit, including a bond pad for monitoring current flow. The RF transistor circuit includes a bias control and feedback circuit connected to the bond pad. Current flowing through at least one of the emitter ballast resistors is routed to the circuit for monitoring current flow. Using the bias control and feedback circuit, the current flowing through the integrated RF transistor is influenced.

3 Claims, 4 Drawing Sheets

- OXIDE
- EMITTER DIFFUSION
- P+, BASE DIFFUSION
- METAL

BALLAST MONITORING FOR RADIO FREQUENCY POWER TRANSISTORS

This application is a continuation of Ser. No. 08/545,905, filed Oct. 19,1995, abandoned, which is a continuation of application Ser. No. 08/335,413, filed Nov. 3, 1994, abandoned.

BACKGROUND OF THE INVENTION

1. Field of the Invention

The present invention relates to power transistors, more particularly to radio frequency (RF) power transistors of the silicon bipolar type. Such transistors are commonly used in amplification stages for radio base station amplifiers, but are also widely used in other RF-related applications.

2. State of the Art

Transistor devices used for power amplification at high frequencies need to meet numerous detailed requirements for output power, gain, ruggedness, efficiency, stability, bandwidth, etc., at a specified supply voltage and operating frequency. The operating frequencies for modem telecommunication electronics range from several hundred megahertz up into the microwave region. The output power requirements range from a few watts up to several hundred watts, using many paralleled devices in one package. Power transistors operate at large signal levels and high current densities. Computer tools presently available are often not sufficient to predict detailed behavior or performance in real applications.

The semiconductor material most commonly used for power transistors (at least for frequencies below 3 GHz) is silicon. Furthermore, because of the higher mobility of electrons as compared to holes, virtually all microwave bipolar transistors are of the NPN type. Epitaxial n on n+ wafers are used as a starting material to reduce collector series resistance. An insulating layer is formed on the semiconductor surface, and base and emitter layers are formed by diffusion or ion implantation. Different doping profiles produce different frequency and breakdown voltage characteristics, and different horizontal geometries produce transistors of different current capabilities.

Interdigitated, overlay and mesh structures have been used to reduce the dimensions of the active areas of power transistors and reduce parasitics, to handle and distribute the large amount of current in the transistor, and to provide heat spreading. An interdigitated structure 10 is shown in FIG. 1 and FIG. 2. Referring to FIG. 1, a pair of interdigitated base and emitter electrodes B and E, respectively, are deposited above an oxide layer overlying a collector diffusion region 11, indicated by dashed lines. As shown in FIG. 2, within the collector diffusion region 11 are located alternating base diffusion regions 13 and emitter diffusion regions 15 underlying the fingers of the base and emitter electrodes B and E, respectively. A transistor is formed by the collector substrate (N), a base diffusion region (P) and an emitter diffusion region (N). Metal emitter fingers 16 are deposited over the emitter diffusion regions and metal base fingers 14 are deposited over the base diffusion regions. All of the base fingers and all of the emitter fingers, respectively, are connected together such that all of the individual transistors are connected together in parallel.

Referring to FIG. 3 and FIG. 4, the overlay structure differs from the interdigitated structure in that the diffusion regions (base and emitter) and the electrode fingers (base and emitter) are transverse to one another. The emitter electrode fingers are overlaid directly on the emitter diffusion regions and are separated from the base diffusion regions by an oxide layer. The emitter diffusion regions are discontinuous so as to allow a base finger to pass between adjacent emitter diffusion regions and connect to different base diffusion regions. The base diffusion regions are continuous.

Referring to FIG. 5 and FIG. 6, in a typical mesh structure power transistor, base diffusion islands 13 are formed within a surrounding emitter diffusion region 15. Two base diffusion regions are joined by adjacent base electrode fingers 14a and 14b on either side of an emitter electrode finger 16.

A traditional metallization layout of a silicon cell 10' is shown in FIG. 7. Because of thermal instability in bipolar transistors, techniques must be used to evenly distribute the current in the transistor. Resistance is therefore added to each segment of the transistor, such that an increase current through a particular emitter will be limited by the resistor. This technique is known as emitter ballasting. A resistor Re is formed in series with each emitter finger, either by diffusion, ion implantation, or deposition of a suitable metal (e.g., nickel-chromium, NiCr) on top of the silicon dioxide. All of the resistors are joined together by the emitter electrode E. An emitter bond pad 17 provides for bonding of a wire to the emitter electrode E. Similarly, all of the base fingers are joined together by the base electrode B, and a base bond pad 19 provides for bonding of a wire to the base electrode B.

Apart from emitter ballasting, in many situations, it is desirable to be able to monitor the current flow through the transistor. Using closed-loop feedback techniques, the transistor bias may then be controlled so as to maintain the transistor current within a desired range. In the prior art, monitoring the amount of current flowing through the transistor has generally been accomplished using an external resistor connected in series with the collector-base current path of the transistor. Such an external resistor consumes power and decreases efficiency. The use of such discrete parts also increases costs and increases the possibility of assembly error.

What is needed, then, is an apparatus and method whereby the current flow through an RF power transistor may be monitored without the use of any external parts.

SUMMARY OF THE INVENTION

The present invention, generally speaking, provides an apparatus and method whereby the current flow through an RF power transistor may be monitored without the use of any external parts. More particularly, in accordance with one embodiment of the invention, an RF power transistor includes a silicon die, a pair of interdigitated electrodes formed on the silicon die, each having a multiplicity of parallel electrode fingers and at least one bond pad. Regions of a first type of diffusion are formed beneath electrode fingers of one electrode of the pair of interdigitated electrodes, and regions of a second type of diffusion are formed beneath electrode fingers of another electrode of the pair of interdigitated electrodes. One electrode has multiple electrode fingers and multiple resistors formed on the silicon die, at least one resistor connected in series with each one of the electrode fingers. A further electrode is provided having at least one electrode finger and connected to a further bond pad, and at least one resistor is formed on the silicon die and connected in series with the further electrode. In accordance with another embodiment of the invention, a method is provided for monitoring and controlling current flow in an integrated RF transistor within an RF transistor circuit. The integrated RF transistor has multiple emitter ballast resistors and a circuit, including a bond pad for monitoring current flow. The RF transistor circuit includes a bias control and feedback circuit connected to the bond pad. Current flowing through at least one of the emitter ballast resistors is routed to the circuit for monitoring current flow. Using the bias control and feedback circuit, the current flowing through the integrated RF transistor is influenced.

BRIEF DESCRIPTION OF THE DRAWING

The present invention may be further understood from the following description in conjunction with the appended drawing. In the drawing.

DETAILED DESCRIPTION OF THE PREFERRED EMBODIMENTS

Figure 1:
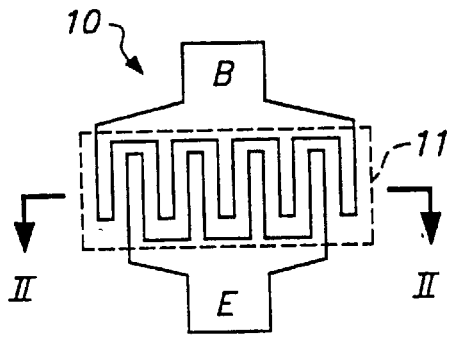
FIG. 1 is a plan view of an interdigitated RF power transistor geometry.
Figure 2:
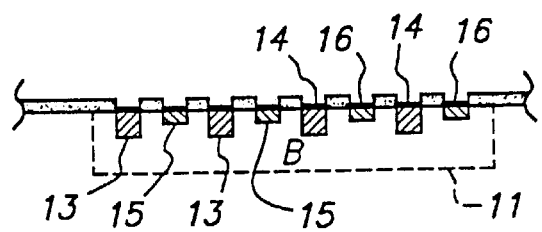
FIG. 2 is a cross-sectional view of the RF power transistor of FIG. 1.
Figure 3:
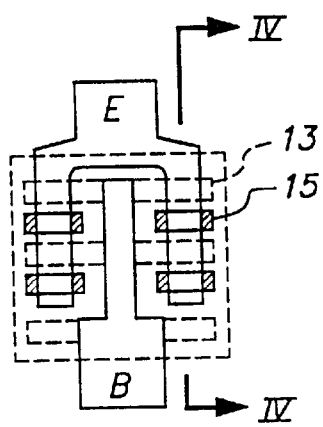
FIG. 3 is a plan view of an overlay RF power transistor geometry.
Figure 4:
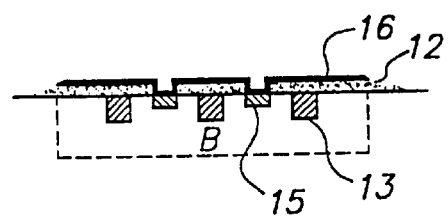
FIG. 4 is a cross-sectional view of the RF power transistor of FIG. 3.
Figure 5:
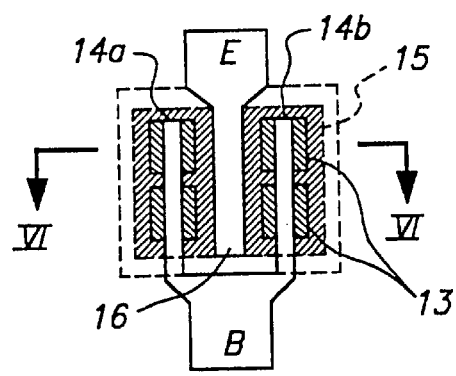
FIG. 5 is a plan view of a mesh RF power transistor geometry.
Figure 6:
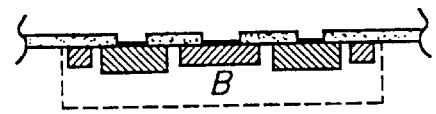
FIG. 6 is a cross-sectional view of the RF power transistor of FIG. 5.
Figure 7:
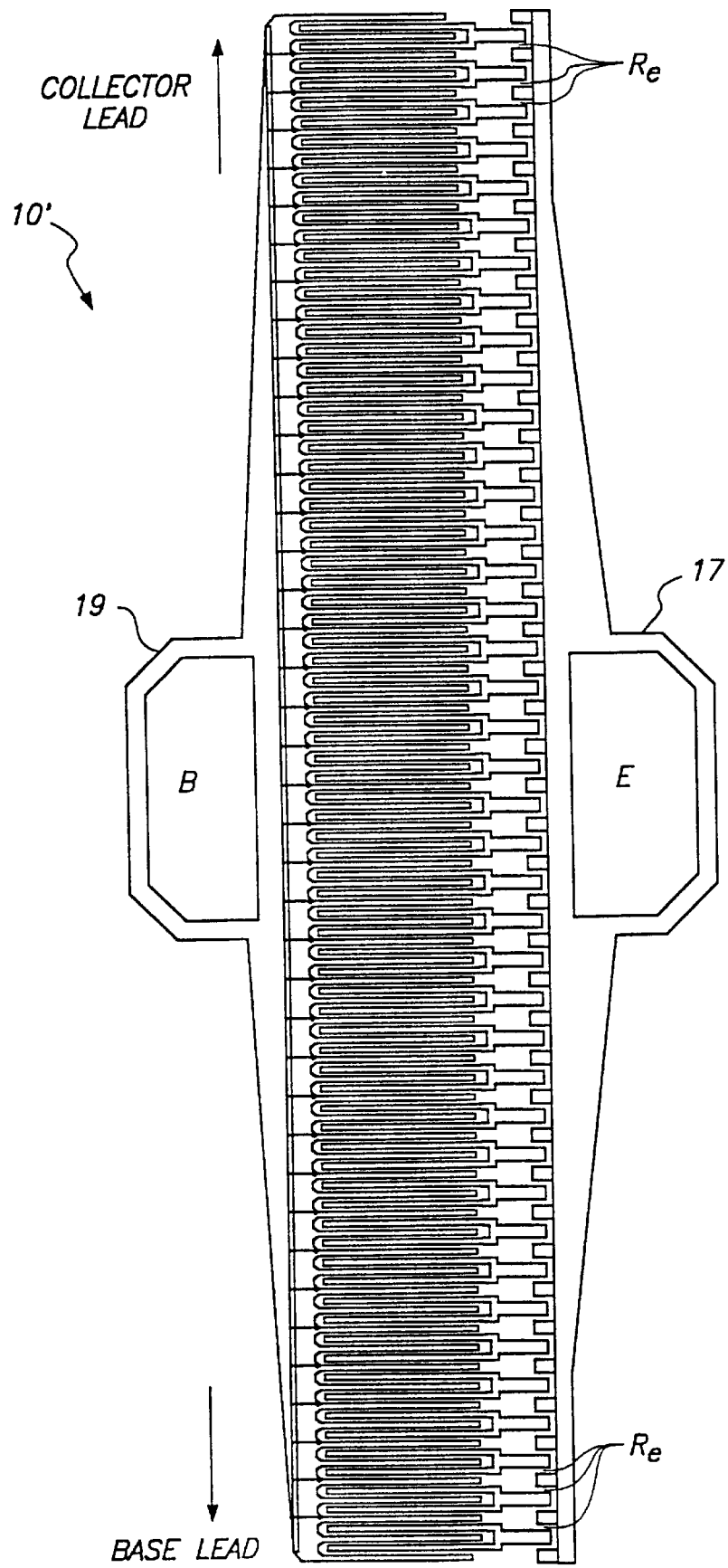
FIG. 7 is a plan view of a conventional layout of an RF power transistor of the interdigitated type.
Figure 8:
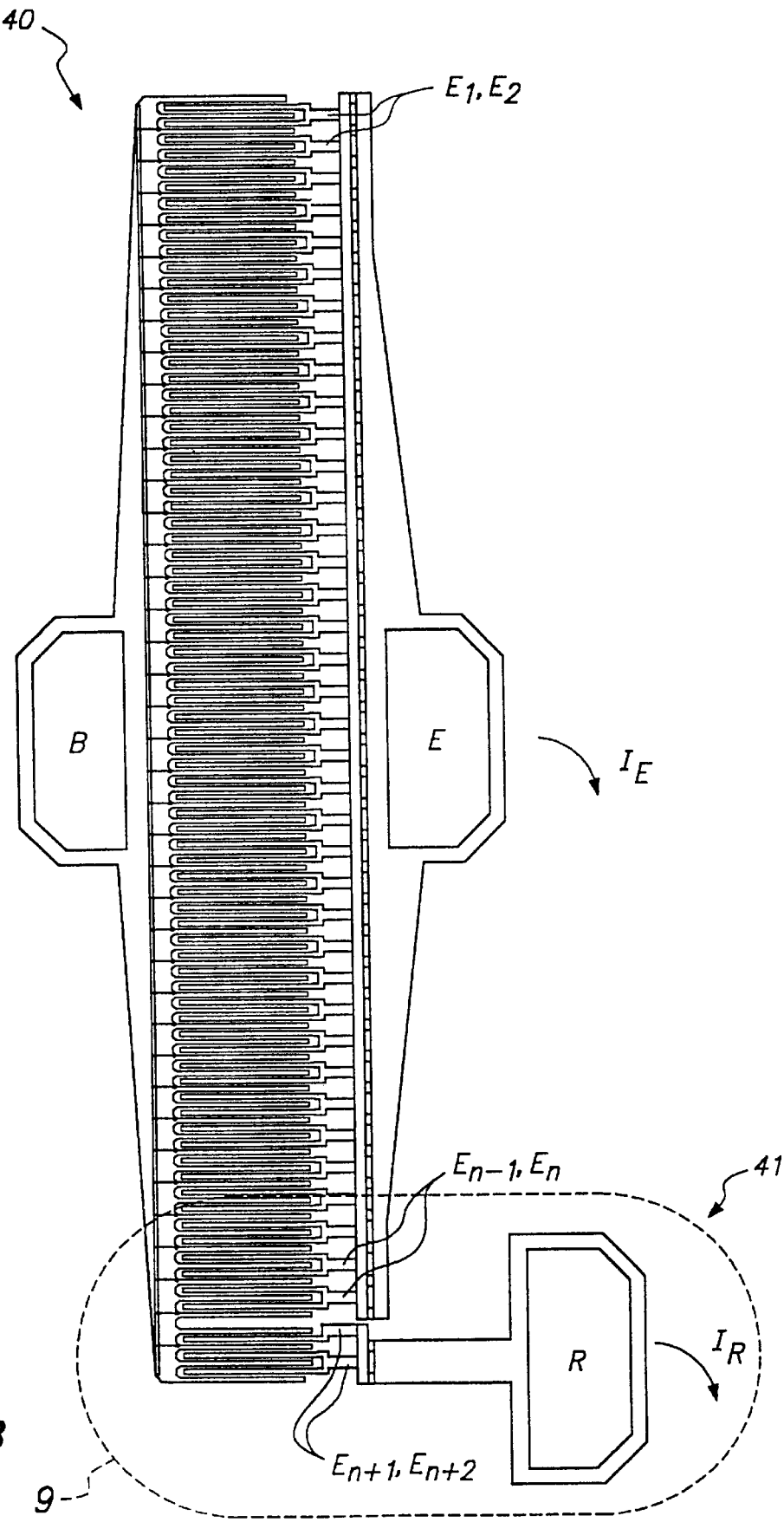
FIG. 8 is a plan view of an interdigitated RF power transistor in accordance with one embodiment of the present invention.

Referring to FIG. 8, a plan view of an RF power transistor 40 in accordance with one embodiment of the present invention is shown. As compared to a conventional layout of an RF power transistor of the interdigitated type, one or more emitter electrode fingers $E_{n+1}$, $E_{n+2}$, rather than being commonly joined with the remaining emitter electrode fingers $E_1 \ldots E_n$ to the emitter electrode E, are connected to a separate bond pad R. Although in FIG. 8 one or more emitter electrode fingers nearest the extremity of the column of transistors are shown as being connected to the separate bond pad R, one or more emitter electrode fingers at one or more positions anywhere along the transistor column may be so connected. Furthermore, although not shown, overlay and mesh transistor cells may be laid out in accordance with the same principle.

Figure 9:
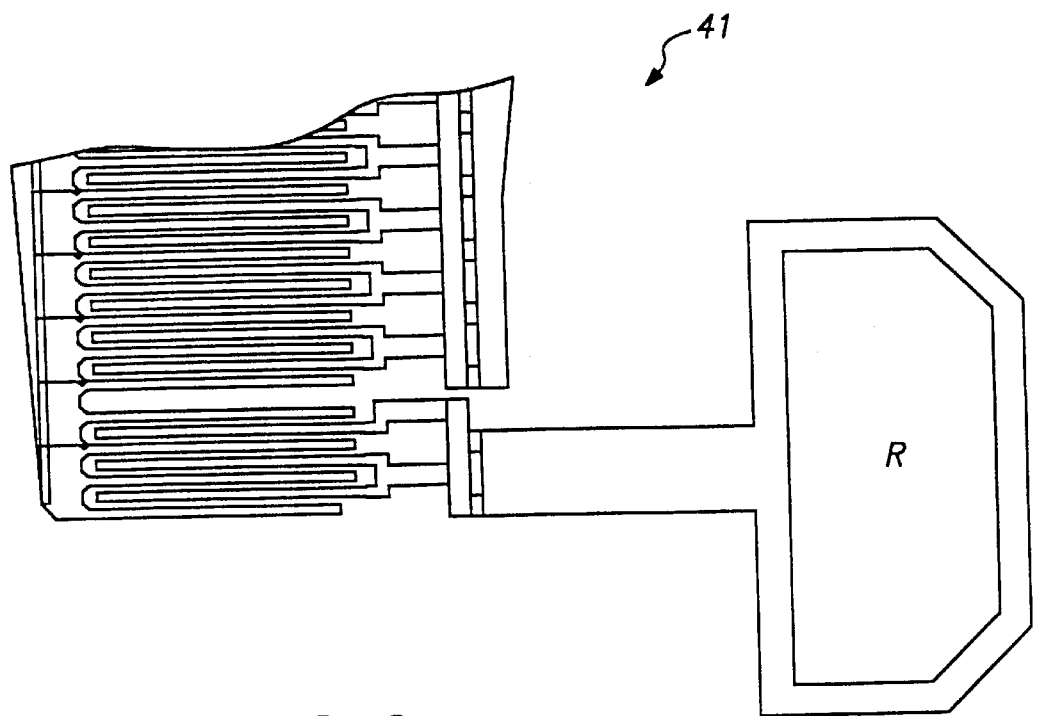
FIG. 9 is an enlarged plan view of a portion of the RF power transistor of FIG. 8.

A portion 41 of the transistor 40 including the emitter electrode fingers $E_{n+1}$, $E_{n+2}$ and the bond pad R is shown in greater detail in FIG. 9.

Because the transistors to which the emitter electrode fingers belong experience the same thermal and process variations as the remaining transistors in the transistor column, if the bond pads E and R are connected to equal loads (for example, both connected to ground as in the typical case), then the current output from the bond pad R will be representative of the current output from the bond pad E. More particularly, the current $i_R$ will be a substantially fixed fraction of the current $i_E$. By monitoring the current $i_R$ without disturbing it, a very accurate indication may be obtained of the total current through the transistor.

Figure 10:
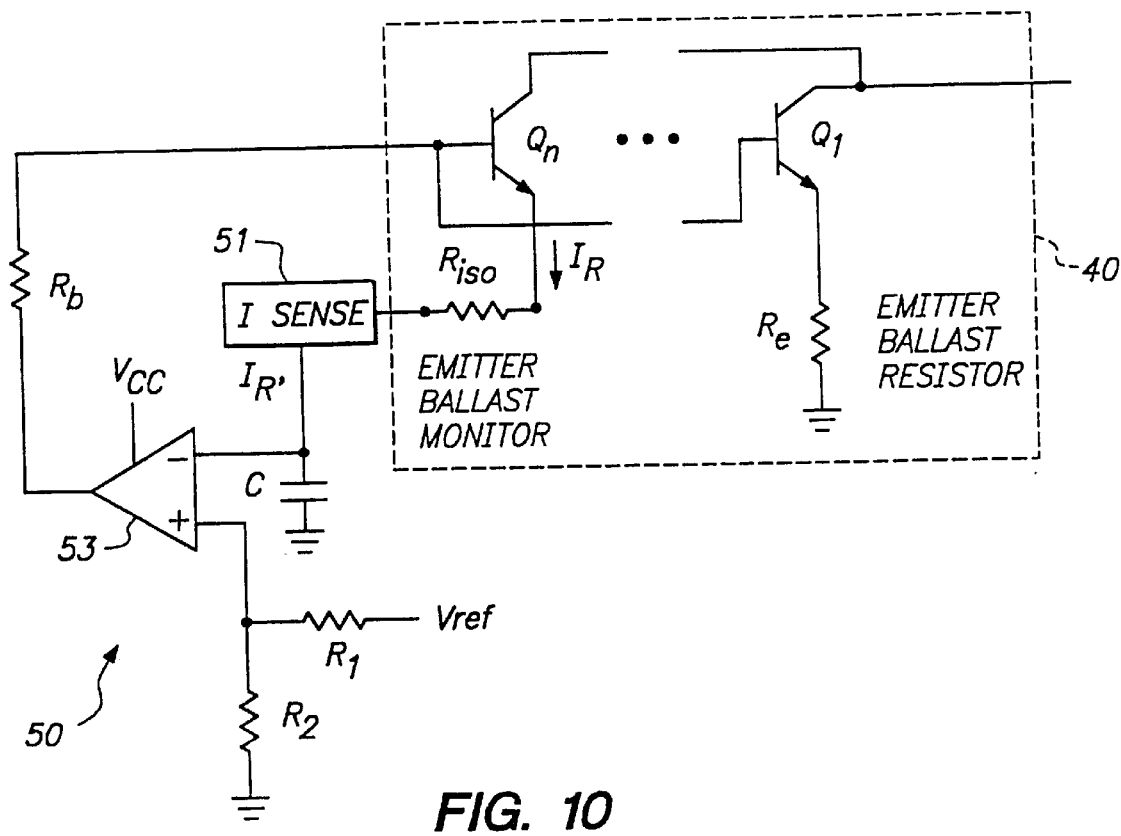
FIG. 10 is a schematic diagram of an RF transistor circuit including the RF power transistor of FIG. 8.

One method whereby the current $i_R$ may be monitored without disturbing the current is to produce a replica $i_R'$ of the current $i_R$ in a manner described in U.S. Pat. No. 5,258,714, incorporated herein by reference. Referring to FIG. 10, an integrated RF transistor 40 may be considered to include a large number of transistors $Q_1 \ldots Q_n$ connected in parallel, i.e., having applied thereto the same collector-emitter voltage and the same base-emitter voltage. Each of the transistors $Q_1 \ldots Q_n$ has its emitter connected through an emitter ballast resistor $r_e$ to ground. In the case of the transistor $Q_n$, however, its emitter ballast resistor is made separately accessible to the outside of the transistor package and hence is designated $r_{iso}$. The emitter ballast resistor is assumed to be connected to ground such that a current $i_R$ flows through it.

The current $i_R$ is replicated using a circuit 51 such as the circuit described in the aforementioned U.S. Pat. No. 5,258,714 to produce a current $i_R'$. This current is input to a feedback and bias control circuit 50. The feedback and bias control circuit 50 includes an operational amplifier (op-amp) 53. Connected to an inverting input of the op-amp is an output lead of the circuit 51 carrying the current $i_R'$ to a capacitor C connected to ground. Connected to a non-inverting input of the op-amp is a voltage dividers network including resistors $R_1$ and $R_2$. The voltage divider network divide a reference voltage $V_{ref}$ and inputs the resulting voltage to the non-inverting input of the op-amp. The output of the op-amp is connected through a resistor $R_b$ to a base lead of the transistor package.

In operation of the RF transistor circuit of FIG. 10, the current $i_R'$ charges the capacitor C to some voltage. That voltage is compared with the divided reference voltage in the op-amp, which produces an output voltage proportional to the difference between its input voltages. The output voltage produced by the op-amp causes a current to flow through the resistor $R_b$ into the base of the transistor, thereby controlling the transistor current.

Assume, for example, that the transistor 40 were to become hot so as to conduct an excessive amount of current. The current $i_R'$ would then increase, causing the output voltage of the op-amp and hence the base current to the transistor to decrease. The current flowing through the transistor would thereby be decreased. In this manner, the RF transistor circuit is self-regulating. Furthermore, this self-regulating behavior may be achieved without adding any external component in series with the collector-emitter current path of the transistor.

By varying the reference voltage $V_{ref}$ in a controlled way, different modes of operation of the transistor may be achieved. For example, the current through the transistor may be modulated in accordance with a particular modulation scheme. Alternatively, different classes of operation may be achieved.

It will be appreciated by those of ordinary skill in the art that the invention can be embodied in other specific forms without departing from the spirit or essential character thereof. The presently disclosed embodiments are therefore considered in all respects to be illustrative and not restrictive. The scope of the invention is indicated by the appended claims rather than the foregoing description, and all changes which come within the meaning and range of equivalents thereof are intended to be embraced therein.

What is claimed is:

1. An RF power transistor, comprising:

a silicon die;

first and second interdigitated electrodes formed on the silicon die, said electrodes each having a plurality of parallel electrode fingers, and each connected in series with at least one respective bond pad;

regions of a first conductivity type of diffussion formed beneath the electrode fingers of said first electrode, and regions of a second conductivity type of diffussion formed beneath the electrode fingers of said second electrode;

a plurality of resistors formed on the silicon die, wherein each of said resistors is connected in series with a respective electrode finger of said first electrode;

a third electrode connected in series to a further bond pad, said third electrode having at least one electrode finger interdigitated with the respective electrode fingers of said second electrode;

regions of said first conductivity type of diffussion formed beneath said third electrode; and a further resistor formed on the silicon die and connected in series with said third electrode, wherein said third electrode, said further resistor, and said further bond pad are electrically isolated from said first electrode and wherein said first and second conductivity types of diffusion are formed within a common diffusion well.

2. The transistor of claim 1, further comprising a current regulating circuit, the current regulating circuit comprising;

a current replicator connected in series with the second resistor and generating a replicated current substantially equal to the current passing through the second resistor;

means for comparing the replicated current with a reference voltage;

means for adjusting the current flowing through the RF power transistor in response to an output of the comparing means.

3. The circuit of claim 2, wherein the respective comparing and adjusting means comprise:

a capacitor connected between the current replicator and a ground, an operational amplifier having an inverting input lead connected between the current replicator and the capacitor, a voltage divider network including a third resistor connected between a non-inverting input lead of the operational amplifier and a reference voltage input, and a fourth resistor connected between the non-inverting input lead and a ground, and a fifth resistor connected between the output lead of the operational amplifier and the second electrode.

* * * * *